US009313922B2

(12) United States Patent
Müller et al.

(10) Patent No.: US 9,313,922 B2
(45) Date of Patent: Apr. 12, 2016

(54) POWER ELECTRONICS SYSTEM WITH LIQUID COOLING SYSTEM

(71) Applicant: Siemens Aktiengesellschaft, München (DE)

(72) Inventors: Alex Müller, Nürnberg (DE); Dirk Trodler, Nürnberg (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 198 days.

(21) Appl. No.: 14/019,074

(22) Filed: Sep. 5, 2013

(65) Prior Publication Data

US 2014/0063741 A1 Mar. 6, 2014

(30) Foreign Application Priority Data

Sep. 6, 2012 (DE) .......................... 10 2012 215 787

(51) Int. Cl.
*H05K 7/20* (2006.01)

(52) U.S. Cl.
CPC ........ *H05K 7/20318* (2013.01); *H05K 7/20927* (2013.01)

(58) Field of Classification Search
CPC ..................... H05K 7/20318; H05K 7/20927
USPC ........................ 361/688–723; 165/80.1–80.5, 165/104.11–104.34
See application file for complete search history.

(56) References Cited

U.S. PATENT DOCUMENTS

| | | | |
|---|---|---|---|
| 2007/0253164 A1* | 11/2007 | Matsuo | H01L 23/473 361/699 |
| 2008/0130223 A1* | 6/2008 | Nakamura | H02M 7/003 361/689 |
| 2008/0169088 A1 | 7/2008 | Aoki et al. | |
| 2009/0231811 A1* | 9/2009 | Tokuyama | H01L 23/36 361/699 |
| 2011/0051371 A1* | 3/2011 | Azuma | B60K 6/445 361/699 |
| 2013/0265808 A1* | 10/2013 | Ishii | H02M 7/003 363/97 |
| 2014/0118932 A1* | 5/2014 | Harmelink | H05K 7/20254 361/689 |

FOREIGN PATENT DOCUMENTS

| | | |
|---|---|---|
| DE | 2007 002 435 T5 | 8/2009 |
| DE | 2008 001 028 A1 | 10/2009 |
| JP | 2005-137116 A | 5/2005 |

* cited by examiner

*Primary Examiner* — Anthony Haughton
*Assistant Examiner* — Yahya Ahmad
(74) *Attorney, Agent, or Firm* — Henry M. Feiereisen LLC

(57) ABSTRACT

A power electronics system includes a multipart housing having three housing elements of cuboid basic structure to define a central element with inlet and outlet ports for a cooling liquid, an upper and lower cover elements which are arranged on opposite connection surfaces of the central element. A plurality of power electronics switching devices is accommodated in the housing, and a condenser device having condenser connection elements is arranged in the central element of the housing> Further provided is a liquid cooling system having at least one first upper cooling chamber between the central element and the upper cover element, and at least two first and second lower cooling chambers between the central element and the lower cover element. The upper and lower cooling chambers are configured for circulation of the cooling liquid entering through the inlet port and exiting through the outlet port of the housing.

22 Claims, 4 Drawing Sheets

POWER ELECTRONICS SYSTEM WITH LIQUID COOLING SYSTEM

CROSS-REFERENCES TO RELATED APPLICATIONS

This application claims the priority of German Patent Application, Serial No. 10 2012 215 787.5, filed Sep. 6, 2012, pursuant to 35 U.S.C. 119(a)-(d), the disclosure of which is incorporated herein by reference in its entirety as if fully set forth herein.

BACKGROUND OF THE INVENTION

The present invention relates to a power electronics system.

The following discussion of related art is provided to assist the reader in understanding the advantages of the invention, and is not to be construed as an admission that this related art is prior art to this invention.

In power electronics systems, particularly when used in vehicles having a main or additional electrical drive, the individual components of the power electronics system have to be cooled. Different components of the power electronics system have hereby different cooling requirement, particularly in terms of heat quantity and thermal capacity.

The power electronics switching device, which is connected by way of example to a drive motor, usually has the highest cooling requirement in respect of the heat quantity to be dissipated. Other power electronics switching devices for charging an energy storage device for example require dissipation of a lower heat quantity. Compared with power electronics switching devices, condenser devices generally require cooling which is less by at least one order of magnitude in respect of heat quantity to be dissipated.

In contrast, there is however the need for the thermal capacity in terms of the working temperature in condenser devices to generally lie more than 20° C. below that of the power electronics switching devices. In addition, power electronics switching devices in most cases have a greater tolerance with respect to temperature peaks than the condenser device.

It would be desirable and advantageous to provide an improved power electronics system to obviate prior art shortcomings and to enable a cooling that is suited to different components, such as power electronics switching devices and a condenser device, according to their respective cooling requirement, in particular according to their respective thermal capacity and their heat quantity to be dissipated.

SUMMARY OF THE INVENTION

According to one aspect of the present invention, a power electronics system includes a multipart housing having three housing elements of cuboid basic structure to define a central element having an inlet port and an outlet port for a cooling liquid, an upper cover element, and a lower cover element, the upper and lower cover elements arranged on opposite connection surfaces of the central element, a plurality of power electronics switching devices accommodated in the housing, a condenser device having condenser connection elements arranged in the central element of the housing, and a liquid cooling system having at least one first upper cooling chamber between the central element and the upper cover element, and at least two first and second lower cooling chambers between the central element and the lower cover element, the upper and lower cooling chambers configured for circulation of the cooling liquid entering through the inlet port and exiting through the outlet port of the housing.

The present invention resolves prior art problems by providing a multipart housing, a plurality of power electronics switching devices, at least one condenser device and a liquid cooling system for cooling all components exhibiting a cooling requirement. The multipart housing has at least three housing elements, which have a basic cuboid configuration, a central element and upper and lower cover elements arranged on opposing connection surfaces of the central element. A cuboid basic shape is herewith understood to mean a significant simplification of the real shape, wherein fixing and fastening devices, such as generally also surface contours of the lateral surfaces, should be disregarded.

According to another advantageous feature of the present invention, the central element and the two cover elements can each have a cup-shaped housing member and a cover member associated to the housing member. Embodiments with the same effect are also to be equivalent to this embodiment for the person skilled in the art.

The housing, advantageously the central element, includes the inlet port and the outlet port for a cooling liquid and thus the connection devices of the liquid cooling system. Advantageously, the central element accommodates in its interior the condenser device with condenser connection elements, which are indirectly or directly connected to at least one power electronics switching device.

According to another advantageous feature of the present invention, at least one of an upper one of the power electronics switching devices can be arranged in the upper cover element. As an alternative or in addition, a lower power electronics switching device can be provided in the lower cover element. At least one of these power electronics switching devices is electrically conductively connected to the condenser device in the central element. For connections of this type, the housing elements have recesses for passage of suitable connectors.

It may also be advantageous to arrange a control switching device in the upper cover element and alternatively or in addition in the lower cover element, to thereby form upper and/or lower control switching devices. The contoured and complementing connection surfaces form at least an upper cooling chamber between the central element and the upper cover element. Likewise, complementing and contoured connection surfaces form at least two lower cooling chambers between the central element and the lower cover element.

The term "connection surface" is herewith understood to relate to surfaces which come into partial contact and are at a distance from one another in sections to thereby form the cooling chambers. In such a way, connecting channels can be configured to connect cooling chambers.

Each cooling chamber has at least one cooling surface. The term "cooling surface" is understood to relate to that part of a boundary surface of a cooling chamber in direct thermal contact with a component to be cooled, in particular a power electronics switching device or a condenser device or respective parts hereof.

The liquid cooling system thus includes the inlet and outlet ports, the cooling chambers and necessary connecting channels for connecting the cooling chamber or connection thereof with the inlet port or outlet port. Cooling liquid can thus circulate through the cooling system by entering at the inlet port and exiting at the outlet port, with cooling liquid advantageously flowing successively through the various cooling chambers.

The liquid cooling system, of course, is provided with suitable seals at various points, especially between housing elements, in particular to seal off electrical terminals. With the concrete embodiment of the liquid cooling system, it should be taken into account that the condenser device, on account of the lower thermal capacity, should take precedence over the power electronics switching device, and requires dissipation of significantly lower heat quantity in comparison with the power electronics switching devices.

As a result, according to another advantageous feature of the present invention, any one of the upper and lower cooling chambers which is in exclusive thermal contact with the condenser device has a smallest pressure loss. As an alternative, it may be advantageous, particularly in the absence of any cooling chamber in exclusive thermal contact with a condenser device, when a cooling chamber which is in exclusive thermal contact with the condenser device and a control switching device has the lowest pressure loss of all the cooling chambers.

Conversely, it is advantageous when a cooling chamber which is in exclusive thermal contact with a power electronics switching device has the highest pressure loss of all the cooling chambers. With such a chamber, which can also have the highest thermal transfer value, it may also be advantageous when a cooling surface has cooling elements, in particular cooling fins or cooling fingers, which are arranged in the cooling chamber and are in thermal contact with the cooling liquid, as a result of which this cooling surface forms a main cooling surface.

The provision of a liquid cooling system according to the invention allows for the condenser device, arranged in the central element, to be cooled on both sides and thus to significantly improve efficiency and uniformity of the cooling effect. This two-sided cooling, in combination with the suitable sequence of through-flow, as provided in the inventive embodiment of the cooling system, produces a very efficient cooling of the condenser device. Due to the low pressure losses, as a result of slight heat dissipation, the pressure loss is low upstream of the cooling chamber of the power electronics switching device.

Furthermore, heat input into the cooling liquid is also low. Therefore, before entry into the cooling chamber of the power electronics switching device, both the pressure loss and also the temperature increase of the cooling liquid are very low, as a result of which cooling conditions of the power electronics circuit are not significantly worse than if the cooling chamber assigned thereto was flowed through first. The necessary cooling of the condenser device is at the same time optimal.

With cooling chambers, which are not only assigned to a condenser device or a power electronics switching device, it is necessary to select a compromise between the pressure loss and dissipated heat quantity as a function of the requirements of the cooling chambers arranged upstream and downstream thereof. It is particularly advantageous when the cooling chambers of the liquid cooling system are flowed through in the order of their pressure loss, starting with the lowest.

In a simplification exclusively for the purpose of clarity, the afore-cited advantages of a power electronics system according to the present invention are particularly clear with a cooling system having two upper cooling chambers and two lower cooling chambers, which are flowed through by cooling liquid in the sequence of inlet port, first lower cooling chamber, first upper cooling chamber, second upper cooling chamber, second lower cooling chamber, outlet port. The first two cooling chambers that are flowed through by cooling liquid are used to cool the condenser device on both sides, i.e. condensers and alternatively or in addition the condenser connection elements of the condenser device, while the further cooling chambers, an upper one and a lower one, are used to cool a power electronics switching device, one upper and one lower power electronics switching device respectively.

According to another advantageous feature of the present invention, the first lower cooling chamber can be connected to the first upper cooling chamber by a first connecting channel, and the second upper cooling chamber can be connected to the second lower cooling chamber by a second connecting channel.

According to another advantageous feature of the present invention, the first upper cooling chamber and the second upper cooling chamber can be degenerated to form a single cooling chamber. As an alternative or in addition, at least one of the lower cooling chambers can be configured in the form of plural sub-cooling chambers.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
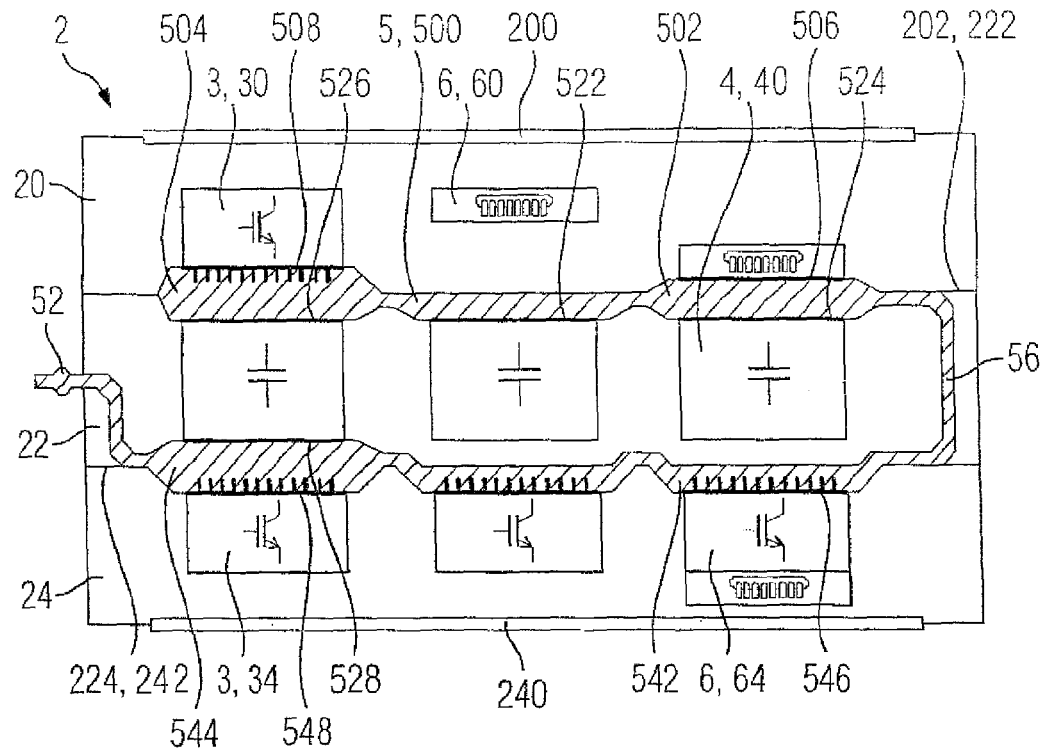
FIG. 1 shows a simplified schematic illustration of a power electronics system according to the present invention.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 2:
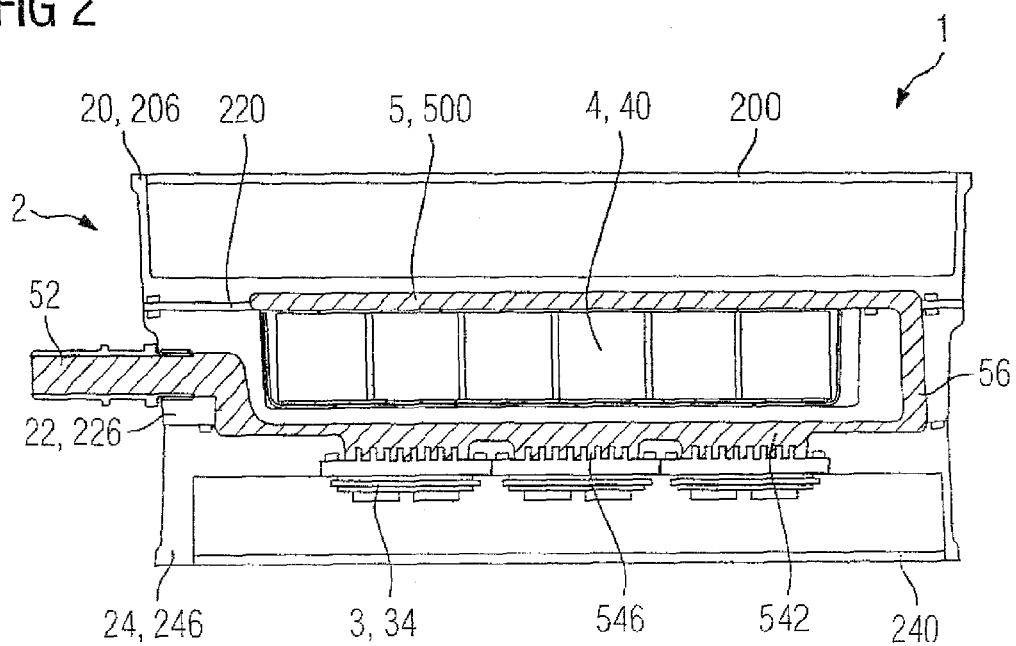
FIG. 2 shows a two-dimensional sectional representation of one embodiment of a power electronics system according to the present invention.
Figure 3:
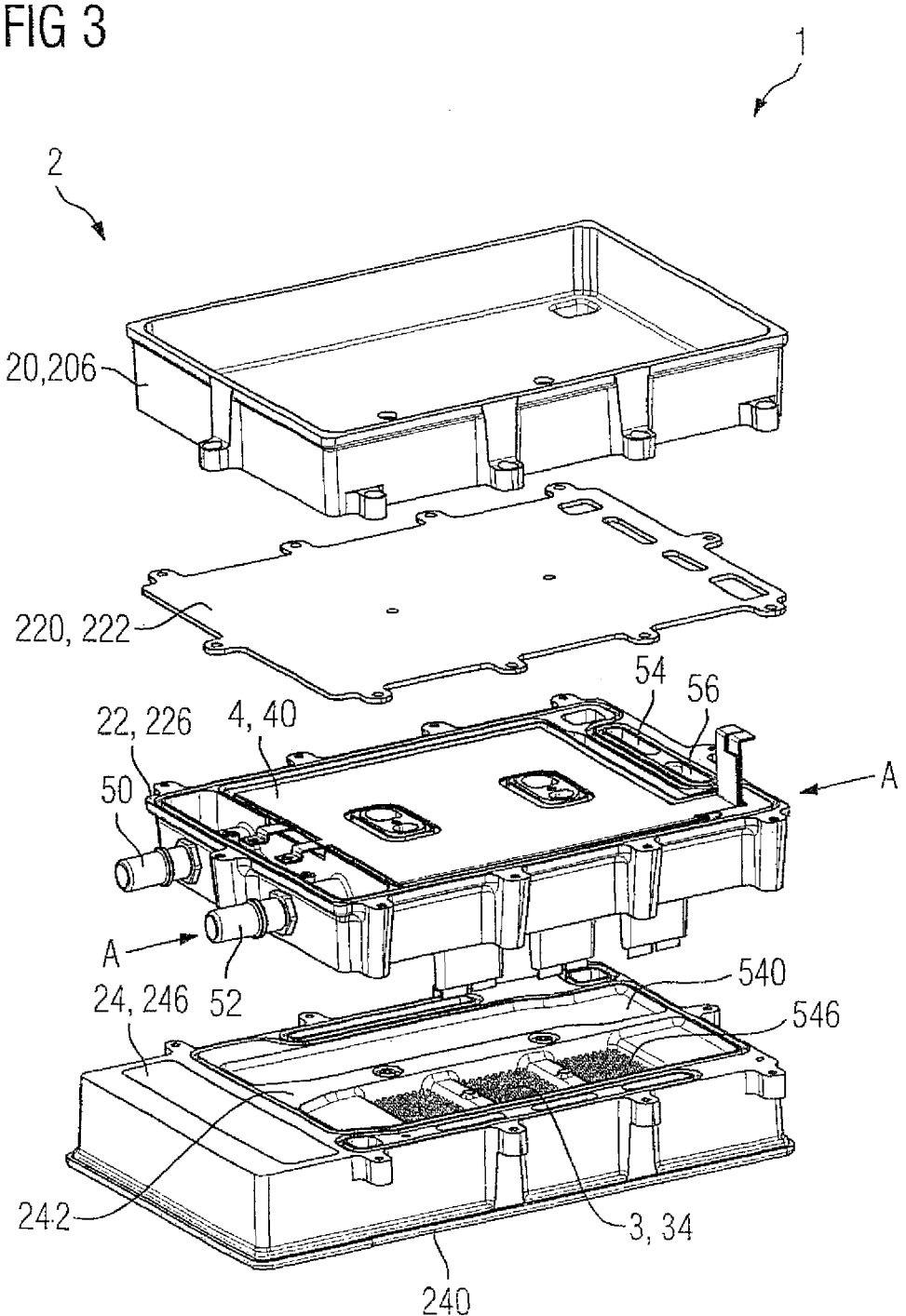
FIG. 3 shows a top and side three-dimensional exploded view of the power electronics system.
Figure 4:
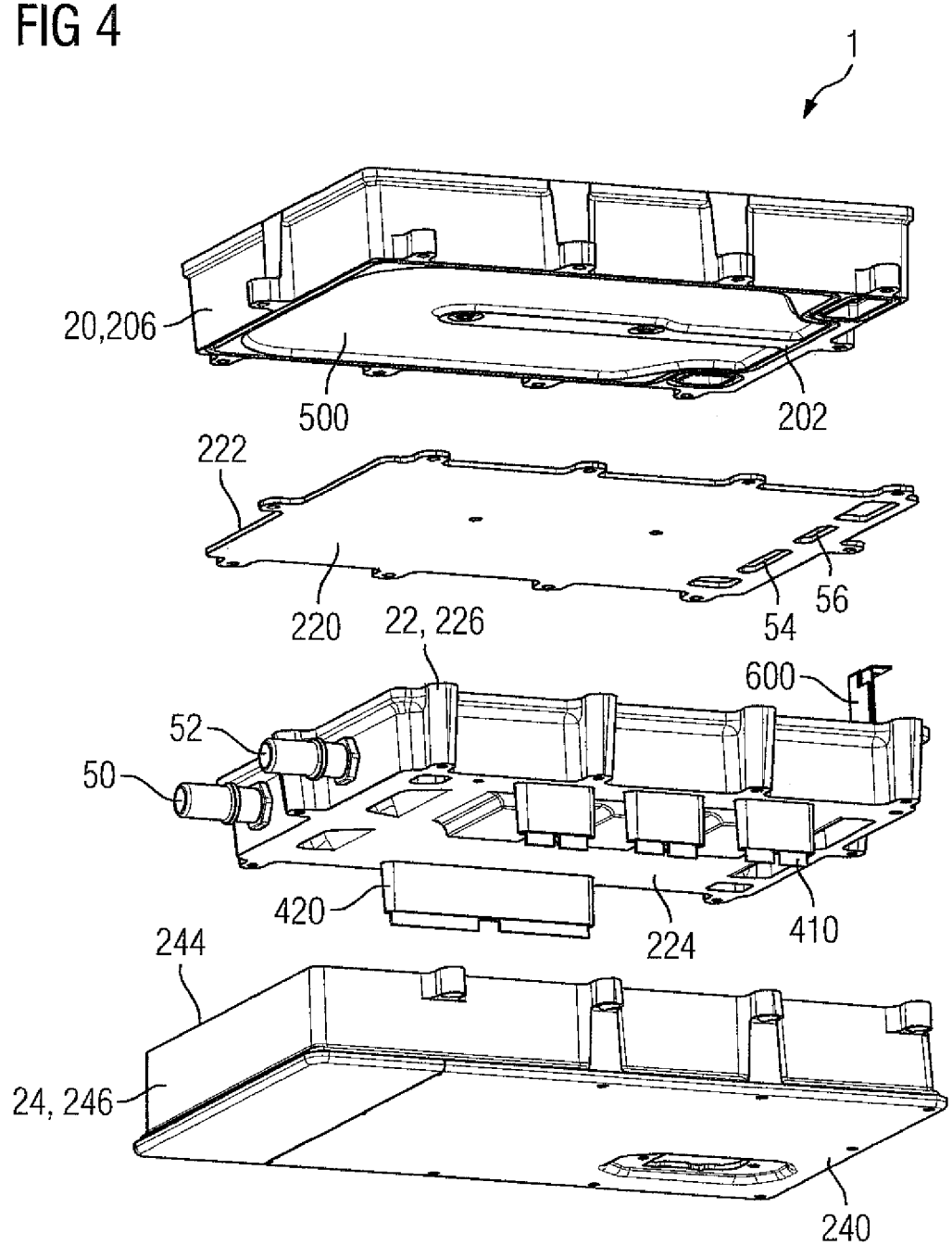
FIG. 4 shows a bottom and side three-dimensional exploded view of the power electronics system.

Turning now to the drawing, and in particular to FIG. 1, there is shown a simplified schematic illustration of a power electronics system according to the present invention, generally designated by reference numeral 1 and explanatory for FIGS. 2 to 4. The power electronics system 1 has a housing 2 comprised of three cuboid housing elements which define an upper cover element 20, a central element 22, and a lower cover element 24. Each of these housing elements 20, 22, 24 is formed by a cup-shaped housing member 206, 226, 246 and an assigned cover member 200, 220, 240. This is shown particularly clearly for the two cover elements 20, 24. The upper cover element 20 is arranged with its connection surface 202 on the upper connection surface 222 of the central element 22 and likewise the lower cover element 24 with its connection surface 242 is arranged on the lower connection surface 224 of the central element 22. The assigned connection surfaces only partially touch one another and are arranged at distances in sections, by providing at least one of the connection surfaces with a surface contour. As a result of this contouring of the surfaces, upper and lower cooling chambers and first connecting channels are formed. The central element 22 furthermore includes an inlet port 50, an outlet port 52 and at least one second connecting channel 54, 56 between the upper and lower chamber areas, which includes the respective cooling chambers and first connecting channels there. These elements form the liquid cooling system 5 of the power electronics system 1.

Although not shown in detail, seals are, of course, provided and arranged as customary, for sealing the liquid cooling system 5, in particular on the connection surfaces 202, 222, 224, 242.

The lower cover element 24 accommodates three lower power electronics switching devices 34. One of these switching devices comprises, in this embodiment, without restricting the generality, a control switching device 64 functionally connected thereto. Similarly without restriction, the upper cover element 20 includes a power electronics circuit 30 and two control switching devices 60 non-functionally connected hereto. The central element 22 accommodates a condenser device 4, which is formed here from three condensers 40, which are functionally connected to the three lower power electronics switching devices 34, without this connection being explicitly shown.

A plurality of different cooling chamber configurations can essentially be embodied based on this embodiment of the power electronics system 1.

In a first variant of a cooling chamber 500, 540, here without restricting the generality, shown with an upper cooling chamber 500, this is in exclusive thermal contact by means of an assigned cooling surface 522 with a condenser device 4, in particular with its condensers 40 themselves or alternatively or in addition with its condenser connection elements 410, 420. In some embodiments of the power electronics system, the cooling of the condenser connection elements gains considerable significance. As is further shown in FIG. 4, the housing member 226 is provided with a terminal 600 for providing electrical connections.

With a second variant of a cooling chamber 502, here likewise shown as an upper cooling chamber, this is in thermal contact with the condenser device 4 and a control switching device 6 by means of two cooling surfaces 506, 524. With a third variant of a cooling chamber, here shown with an upper 504 and a lower 544 cooling chamber, this is thermal contact with the condenser device 4 by means of a cooling surface 526, 528 respectively and with a respective power electronics switching device 30, 34 by means of a further respective cooling surface, here in each case a main cooling surface 508, 546, 548. The respective main cooling surface 508, 546, 548 has cooling fingers, as a result of which the cooling output of this main cooling surface is essentially better by at least a factor of two compared with a cooling surface with the same base surface. An increased pressure loss of the cooling liquid generally accompanies this improved cooling output. With a fourth variant of a cooling chamber 542, here a lower cooling chamber, the single cooling surface 546 is in thermal contact with a power electronics circuit 34. In order to be able to fulfill the cooling requirements of power electronics circuits, it is advantageous in each instance to embody the cooling surfaces assigned thereto, as shown, as main cooling surfaces.

The liquid cooling system of a power electronics system, which, for the sake of clarity, is taken into consideration without control switching devices 60, 64, is particularly preferably, see hereto also FIG. 5, embodied such that the cooling liquid flows through the liquid cooling system 5 in the following order:

inlet port 50;
a lower cooling chamber 540 of the first variant;
connecting channel 54 from below to the upper chamber area;
one or a number of upper cooling chambers 500 of a first variant;
connecting channel 56 from the upper to the lower chamber area
a plurality of lower cooling chambers 542 of a fourth variant;
outlet port 52.

It is herewith understandable that if necessary the upper or the lower connecting channels are likewise flowed through.

FIGS. 2 to 4 show a power electronics system 1 according to this cited embodiment.

Figure 5:
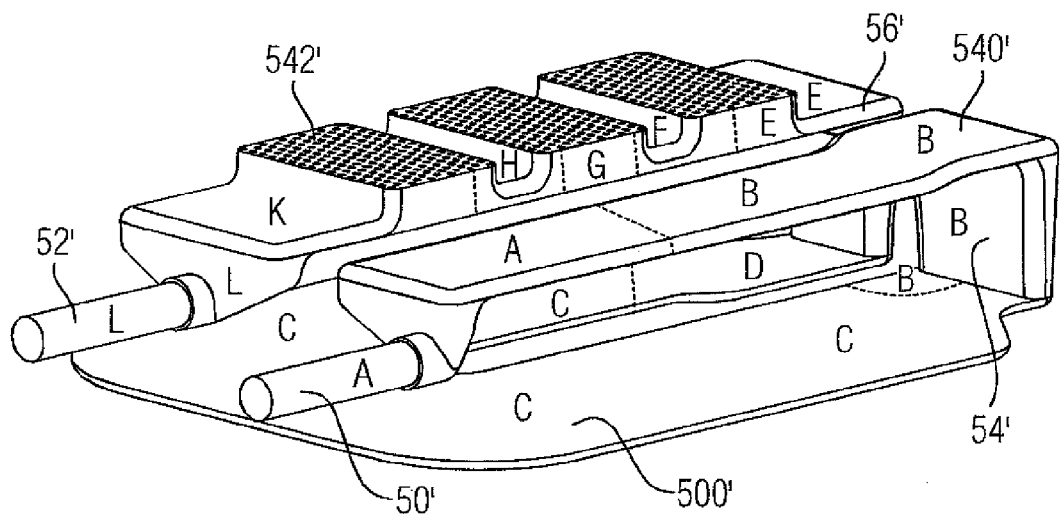
FIG. 5 shows a three-dimensional representation of a liquid cooling system in the power electronics system according to the present invention.

FIG. 5 shows the cooling liquid and its pressure loss in a power electronics system 1 of this type, wherein the liquid is provided here in corresponding areas of the power electronics system with a stroke following the reference character. The parts of the housing forming the liquid cooling system are thus not shown explicitly, but instead the cooling liquid contained in the liquid cooling system. FIG. 2 shows the inventive power electronics system in a two-dimensional sectional representation along a section A-A according to FIG. 3, whereas FIGS. 3 and 4 show the power electronics system in an exploded view from two different viewing directions.

The three-part housing 2 of the power electronics system is shown, consisting of the upper cover element 20 which (not shown) has an activation switching device. The upper cover element 20 is embodied like the remaining housing parts as a cup-type housing member 206 with an assigned cover member 200.

A condenser device 4 with condensers 40 and second condenser connection elements 420 for connection with a external DC source, and also with a plurality of first condenser connection elements 410 for connection with power electronics switching devices 34 of the power electronics system, is arranged in the central element 22.

Similarly, the inlet port 50 and also the outlet port 52 are likewise arranged in this central element 22 for the cooling liquid to flow through the liquid cooling system 5. The height extension of the central element 22, in other words the distance between the upper and lower cover element, is dependent in this embodiment on the capacity of the condenser device 4 and can thus be embodied variably as a function hereof. Three power electronics switching devices 34, embodied in each instance as semibridge circuits, are arranged in the lower cover element 24.

The liquid cooling system 5 of the power electronics system consists, in addition to the inlet 50 and outlet port 52, of an upper and a lower chamber area, which in each instance comprises cooling chambers and first connecting channels and second connecting channels 54, 56 connecting the chamber areas. A cooling chamber herewith by definition, in contrast to a first connecting channel, comprises a cooling surface for thermal connection with a component to be cooled, such as a condenser device, a control switching device or a power electronics switching device. Basically the cooling chamber and first connecting channel can pass into one another without a change in cross-section. The first chamber area, and/or the cooling chambers and first connecting channels there are embodied by a contouring of the connection surface 202 of the upper cover device 20 and the upper connection surface 222 of the central element 22. Similarly, the second chamber area is embodied by a contouring of the connection surface 242 of the lower cover device 24 and the lower connection surface 224 of the central element 22.

FIG. 5 shows the cooling liquid, as it spreads in the liquid cooling system 5 and the pressure losses developing on account of the various embodiments of the cooling chambers. It can be seen that downstream of the inlet 50, the cooling liquid flows through a first lower cooling chamber of a first variant, thereby only involving a minimal temperature rise and above all only a low pressure loss. The upper cooling chambers virtually degenerated to form a cooling chamber on account of the corresponding embodiment of the connecting channel are likewise embodied according to the first variant and comprise a comparably low pressure loss like the first lower cooling chamber. The heat input is likewise low here since the condenser device 4 requires a low heat discharge compared with the power electronics switching devices 30, 34. Nevertheless, the thermal capacity, in particular the desired operating temperature of the condenser device 4, is significantly lower than that of the power electronics switching devices. For instance, the operating temperature of the condenser device is not to exceed 90° C., whereas the power semiconductor elements of the power electronics switching devices are configured for operating temperatures of up to 150° C., frequently even up to 175° C.

Those cooling chambers, which are in thermal contact with the power electronics switching devices 30, 34, have the largest heat input into the cooling liquid, as a result of which the cooling surfaces are embodied as main cooling surfaces with cooling elements, such as cooling fins or cooling fingers. The significantly higher heat input is thus also accompanied by a higher pressure loss.

In summary, the cooling chamber which is in exclusive thermal contact with the condenser device has the lowest pressure loss of all the cooling chambers. If such cooling chambers are not provided, the cooling chamber which is in exclusive thermal contact with the condenser device and a control switching device has the lowest pressure loss of all the cooling chambers. By contrast, the cooling chamber which is in exclusive thermal contact with a power electronics switching device has the highest pressure loss of all cooling chambers. This thus means that the last cooling chamber flowed through has a pressure loss which is higher by at least a factor of 1.6, in particular by a factor of 3, than the first cooling chamber flowed through.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A power electronics system, comprising:
   a multipart housing having three housing elements of cuboid basic structure to define a central element having an inlet port and an outlet port for a cooling liquid, an upper cover element, and a lower cover element, said upper and lower cover elements arranged on opposite connection surfaces of the central element;
   a plurality of power electronics switching devices accommodated in the housing;
   a condenser device having condenser connection elements arranged in the central element of the housing; and
   a liquid cooling system having a plurality of cooling chambers located between all three elements and including at least one first upper cooling chamber between the central element and the upper cover element, and at least two first and second lower cooling chambers between the central element and the lower cover element, said upper and lower cooling chambers configured for circulation of the cooling liquid entering through the inlet port and exiting through the outlet port of the housing.

2. The power electronics system of claim 1, wherein each of the housing elements has a cup-shaped housing member and a cover member associated to the cup-shaped housing member.

3. The power electronics system of claim 1, wherein at least one of an upper one of the power electronics switching devices and an upper control switching device is arranged in the upper cover element.

4. The power electronics system of claim 1, wherein at least one of a lower one of the power electronics switching devices and a lower control switching device is arranged in the lower cover element.

5. The power electronics system of claim 1, wherein any one of the upper and lower cooling chambers which is in exclusive thermal contact with a power electronics switching device has a highest pressure loss.

6. The power electronics system of claim 1, wherein any one of the upper and lower cooling chambers which is in exclusive thermal contact with the condenser device has a smallest pressure loss.

7. The power electronics system of claim 1, wherein any one of the upper and lower cooling chambers which is in exclusive thermal contact with the condenser device and a control switching device has the smallest pressure loss.

8. The power electronics system of claim 1, wherein the upper and lower cooling chambers are circulated by cooling liquid in the order of their pressure loss, with cooling liquid flowing first through the one of the cooling chambers with a lowest pressure loss.

9. The power electronics system of claim 8, wherein the one of the cooling chambers through which cooling liquid flows last has a pressure loss by at least a factor of 1.6 in comparison with the cooling chamber circulated first by the cooling liquid.

10. The power electronics system of claim 1, further comprising a terminal provided between adjacent ones of the housing elements for providing an electrical connection.

11. The power electronics system of claim 1, wherein each of the upper and lower cooling chambers has at least one cooling surface formed by a cooling element, in thermal contact with the cooling liquid to thereby define a main cooling surface.

12. The power electronics system of claim 11, wherein the cooling element is a cooling fin or cooling finger.

13. The power electronics system of claim 1, wherein the cooling system has a second upper cooling chamber, said cooling system being configured for flow of cooling liquid in a sequence of inlet port, first lower cooling chamber, first upper cooling chamber, second upper cooling chamber, second lower cooling chamber, and outlet port.

14. The power electronics system of claim 1, wherein the cooling system has a second upper cooling chamber, the first lower cooling chamber being connected to the first upper cooling chamber by a first connecting channel, and the second upper cooling chamber being connected to the second lower cooling chamber by a second connecting channel.

15. The power electronics system of claim 1, wherein at least one of the condenser device and condenser connection elements of the condenser device are in thermal contact with the first upper cooling chamber and the first lower cooling chamber via associated cooling surfaces so as to provide cooling on both sides.

16. The power electronics system of claim 1, wherein the cooling system has a second upper cooling chamber, wherein a lower one of the power electronics switching devices is in thermal contact with at least one of the second lower cooling chamber and the second upper cooling chamber.

17. The power electronics system of claim 16, wherein an upper one of the power electronics switching devices is in exclusive thermal contact with the second upper cooling chamber, said lower power electronics switching device being in exclusive thermal contact with the second lower cooling chamber.

18. The power electronics system of claim 1, wherein the cooling system has a second upper cooling chamber, wherein the first upper cooling chamber and the second upper cooling chamber are degenerated to form a single cooling chamber.

19. The power electronics system of claim 1, wherein at least one of the lower cooling chambers is configured in the form of plural sub-cooling chambers.

20. The power electronics system of claim 1, wherein the central element is height-variable as a function of a capacity of the condenser device.

21. The power electronics system of claim 1, wherein said upper cooling chamber is arranged at a horizontal location which is between horizontal locations of said lower cooling chambers.

22. The power electronics system of claim 1, further comprising a second upper chamber located between said central element and said upper cover, said upper cooling chambers are arranged same horizontal locations as said lower cooling chambers.

* * * * *

UNITED STATES PATENT AND TRADEMARK OFFICE
CERTIFICATE OF CORRECTION

PATENT NO. : 9,313,922 B2  
APPLICATION NO. : 14/019074  
DATED : April 12, 2016  
INVENTOR(S) : Alex Müller and Dirk Trodler It is certified that error appears in the above-identified patent and that said Letters Patent is hereby corrected as shown below:

On the title page, column two, under FOREIGN PATENT DOCUMENTS, please correct "DE 2007 002 435 T5" to read --DE 11 2007 002 435 T5-- as well as "DE 2008 001 028 A1" to read --DE 10 2008 001 028 A1--.

Signed and Sealed this
Twenty-first Day of June, 2016

Michelle K. Lee
*Director of the United States Patent and Trademark Office*